United States Patent [19]

Okada

[11] Patent Number: 5,220,723
[45] Date of Patent: Jun. 22, 1993

[54] PROCESS FOR PREPARING MULTI-LAYER PRINTED WIRING BOARD

[75] Inventor: Keisuke Okada, Tokyo, Japan

[73] Assignee: NEC Corporation, Tokyo, Japan

[21] Appl. No.: 787,128

[22] Filed: Nov. 4, 1991

[30] Foreign Application Priority Data

Nov. 5, 1990 [JP] Japan .................. 2-299333

[51] Int. Cl.⁵ .................................. H05K 3/36
[52] U.S. Cl. ........................ 29/830; 156/902
[58] Field of Search .............. 29/830, 852; 428/901; 156/902

[56] References Cited

U.S. PATENT DOCUMENTS

| | | | |
|---|---|---|---|
| 3,867,759 | 2/1975 | Siefker | 29/830 |
| 4,496,793 | 1/1985 | Hanson et al. | 29/830 X |
| 4,780,957 | 11/1988 | Shiga et al. | 29/830 |
| 4,817,280 | 4/1989 | Ozaki | 29/830 X |
| 4,854,038 | 8/1989 | Wiley | 29/830 |
| 4,864,722 | 9/1989 | Lazzarini et al. | 29/830 |
| 4,868,350 | 9/1989 | Hoffarth | 29/830 X |

Primary Examiner—Carl J. Arbes
Attorney, Agent, or Firm—Leydig, Voit & Mayer

[57] ABSTRACT

Disclosed is a process for preparing a multi-layer printed wiring board including the step of forming a through hole and an external layer circuit on a laminated board of double-sided or multi-layer construction. Then the laminated board is coated over the whole front and back surfaces with a paste-like heat-resistant resin, simultaneously filling the through hole with a resin. A copper foil is disposed on the whole front and back surfaces of the laminated board. Next, the arrangement is heated and pressure-molded in a vacuum. The copper foil is then removed to form an intermediate laminated board. Then, multilayer molding of at least two sets of intermediate laminated boards with a prepreg interposed therebetween is preformed via a step of heat and pressure-molding. In using the penetrated through hole as the divided via hole, there is no longer a restriction of the thickness of the respective divided via holes on the same lattice point. Thus, it has become possible to use the via holes in a higher multilayer board, dramatically improving wiring capacity over the prior art divided via holes.

5 Claims, 3 Drawing Sheets

PROCESS FOR PREPARING MULTI-LAYER PRINTED WIRING BOARD

BACKGROUND OF THE INVENTION

This invention relates to a process for preparing a multi-layer printed wiring board, particularly to a process for preparing a multi-layer printed wiring board having on the same lattice a plurality of via holes formed by dividing a conductor layer which is part of a via hole on the same lattice for the purpose of high density mount.

For the purpose of making LSI, IC, etc. highly integrated, enhancing performances of electronic instruments and improving economical problems, higher densification of multi-layer printed wiring board (hereinafter abbreviated as multi-layer board) is in progress.

For higher densification of multi-layer boards, two measures have primarily been taken.

The first measure is increase of the number of conductor layers, namely multi-layer formation, and the second one is to multi-wiring between the basic lattices. However, the first measure will result in increase of via holes connecting the conductor layers between the layers, while in the multi-wiring according to the second measure, wiring capacity will be markedly limited. Accordingly, these inconveniences are compensated for by reducing via hole diameter, making wired conductor finer, etc., but all of these interfere with productivity of multi-layer boards.

As a method for solving this problem, there has been proposed a multi-layer board having buried via holes or surface (blind) via holes.

In the following, a representative preparation process is described by referring to FIG. 1 as an example.

First, as shown in FIG. 1(A), a laminated board is drilled and panel-plated to form a via hole as a surface via hole 14, and next, an internal layer circuit pattern 15 is formed only on one surface according to the photoprinting method to prepare a surface via internal layer board 16.

Similarly, as shown in FIG. 1(B), a laminated board is drilled and panel-plated to form a via hole as a buried via hole 17, and next, internal layer circuit patterns 15a and 15b are formed on the both surfaces according to the photoprinting method to prepare a buried via internal layer board 18.

In the next step, as shown in FIG. 1(C), the previous two kinds of internal layer boards 16, 18, 16a are set with prepregs 7 and 7a being interposed, and via the heating and pressurizing steps as shown in FIG. 1(D), a multi-layer molded substrate with each internal layer board being integrated with a prepreg layers 10 and 10a is obtained.

Next, as shown in FIG. 1(E), at the predetermined sites on a multi-layer molded substrate 11 are perforated penetrated holes, which are applied with panel plated layers 19, 19a and 19b to form a penetrated via hole 12, followed by photoprinting process, thereby obtaining a multi-layer printed wiring board 13 having surface via holes 14 and 14a and a buried via hole 17 according to the preparation process of the prior art.

Also there has been known a method, in which at the surface via holes are formed conventional copper-clad multi-layer boards, and from the external layer surface are perforated half-penetrated holes by L/C driller, laser process, etc., and then conventional panel plating and photo-printing are applied to connect the external layer and the internal layer immediately below the external layer through the half-penetrated hole, thereby obtaining surface via holes (not shown).

The preparation process of the prior art as described above has the following drawbacks.

First, a resin to be filled within the surface via holes and the buried via hole is accounted for only by the resin contained in the prepregs. Therefore, the thickness of the internal layer board can be obtained only to the extent which is the same as the prepreg layer, and the thickness of this kind of internal layer board is about 0.3 to 0.4 mm at the maximum, whereby multi-layer formation has been almost impossible.

Accordingly, when via holes are generally formed on the same lattice with a multi-layer board including more than 10 layers in a double-sided internal board, there are only two kinds of methods broadly classified, namely the method of forming surface via holes and buried via holes, or forming penetrated through holes and using them as via holes. Particularly, in the case of the penetrated via holes of the latter, only one hole can be arranged on one lattice point, causing the problem of via hole neck becoming more disadvantageous as more multiple layer formation is attempted.

An object of the present invention is to provide a process for preparing a multi-layer printed wiring board which overcomes the via hole neck problem which becomes more disadvantageous as more multiple layer formation is attempted.

SUMMARY OF THE INVENTION

The process for preparing a multi-layer printed wiring board of the present invention comprises the step of forming a through hole and an external layer circuit on a laminated board of double-sided or multi-layer construction, then coating the whole front and back surfaces of said laminated board with a paste-like heat-resistant resin simultaneously with filling of the resin within said through hole, arranging a copper foil on the whole front and back surfaces of said laminated board, heat and pressure-molding the arangement in vacuo, and then removing said copper foil to form an intermediate laminated board and the step of multilayer-molding at least two sets of said intermediate laminated boards with a prepreg interposed therebetween via the step of head and pressure molding.

DETAILED DESCRIPTION OF THE PREFERRED EMBODIMENTS

Figure 1A:
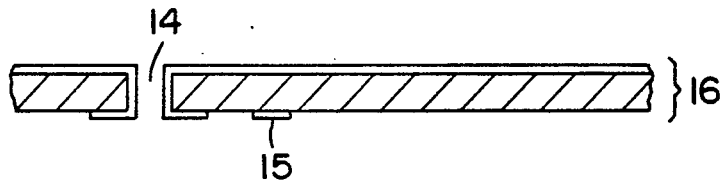
FIGS. 1(A) to 1(E) are sectional views shown in the order of the steps for illustration of an example of a process for preparing a multi-layer printed wiring board of the prior art.
Figure 1B:
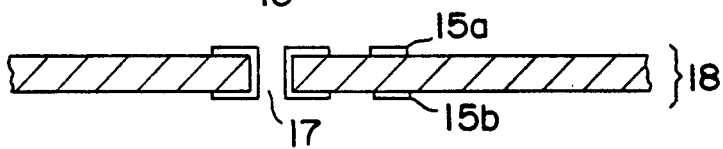
Figure 1C:
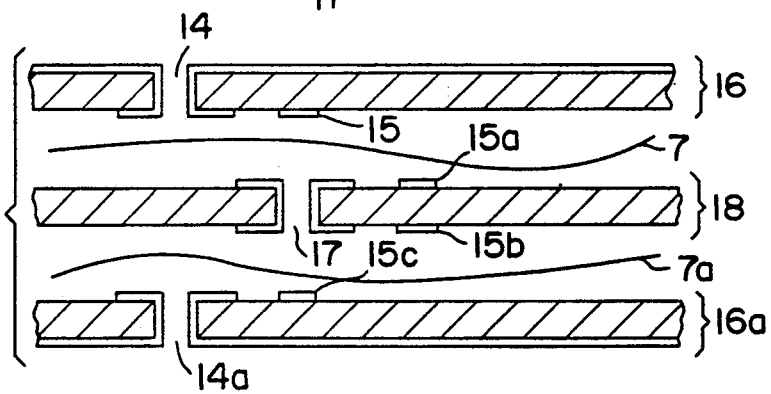
Figure 1D:
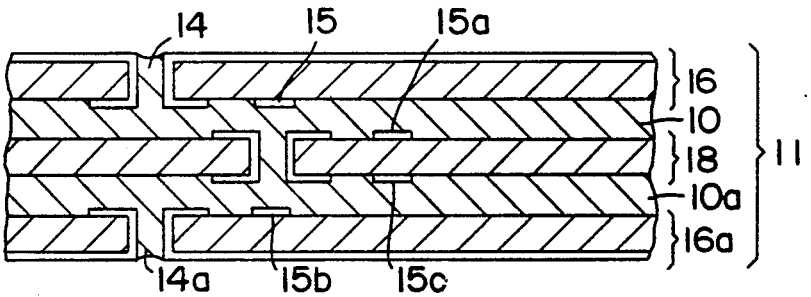
Figure 1E:
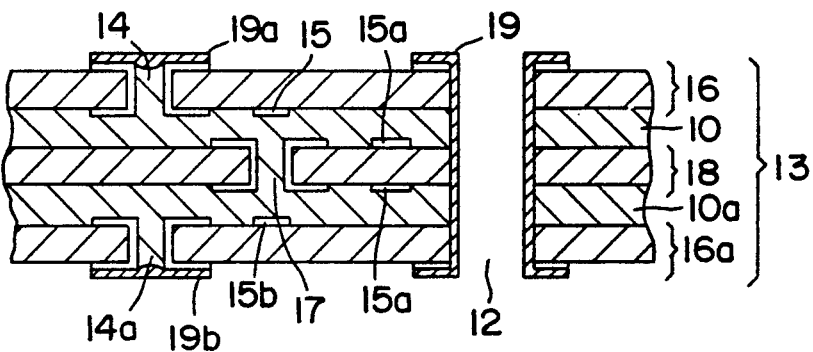

Referring now to the drawings, the embodiments of the present invention are described.

FIG. 2 is a sectional view showing the preparation process of the first embodiment of the present invention in the order of the steps.

Figure 2A:
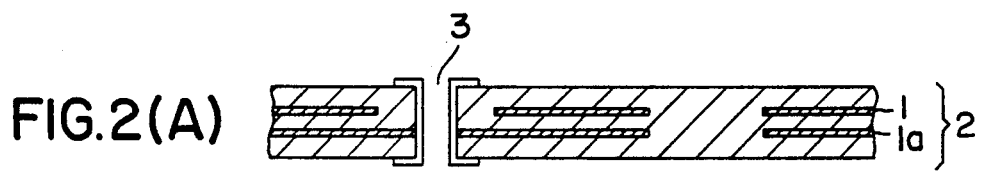
FIGS. 2(A) and 2(F) are sectional views shown in the order of the steps for illustration of the first embodiment of the present invention.

The first embodiment as shown in FIG. 2(A), T/H process is applied previously at any desired site of a laminated board 2 lamination-molded having any desired internal layer conductors 1 and 1a (experimentally prepared with 4 layers for this time) to form divided via holes which will finally become the divided via holes.

Figure 2B:
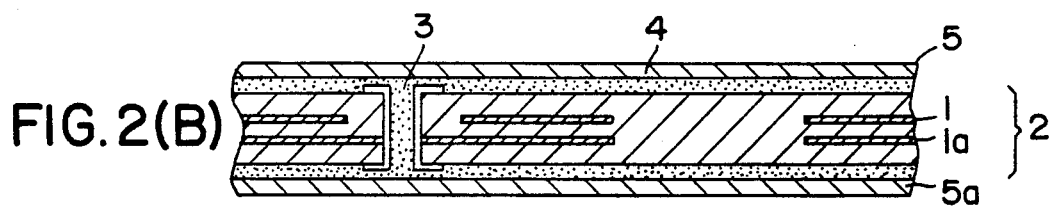

In the next step, as shown in FIG. 2(B), a paste-like heat-resistant resin 4 comprising glass fillers with lengths of 10 to 30 μm and an average diameter of 3 μm formulated with a bisphenol A type epoxy resin is filled in the divided via holes 3 with a roll coater simultaneously with coating also on the front and back of the laminate board 2 with the heat-resistant resin 4 (not shown), and subsequently copper foils 5 and 5a for molding with a thickness of 70 μm are arranged on the front and back of the laminated board 2, followed by heat and pressure holding with a box type vacuum press under the condition of a vacuum degree of 30±15 Torr.

Figure 2C:
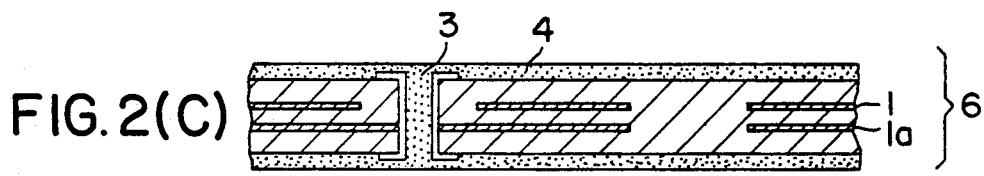

Subsequently, as shown in FIG. 2(C), copper foils 5 and 5a for molding are etched with an etchant comprising cupric chloride as the base to obtain an intermediate laminated board 6.

Figure 2D:
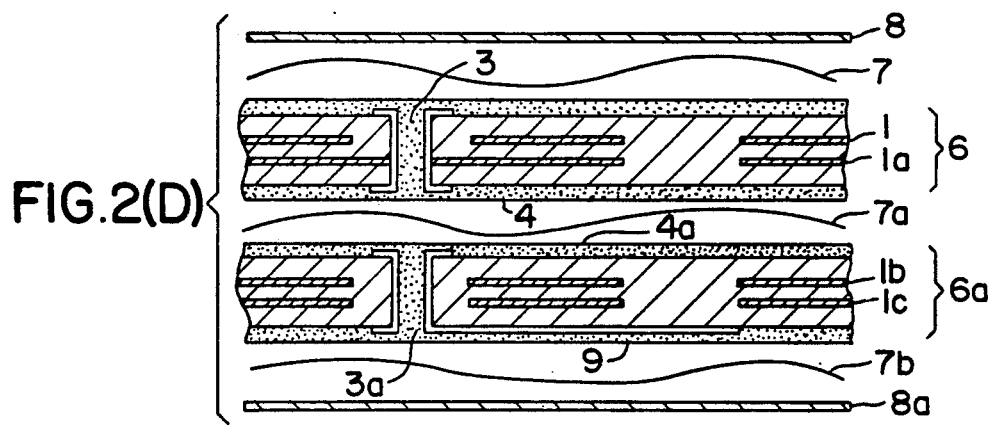

Next, as shown in FIG. 2(D), two sets of intermediate laminated boards 6 and 6a are prepared, prepregs 7, 7a and 7b interposed therebetween and copper foils 8 and 8a with a thickness of 18 μm are arranged as the outermost layer. One of the intermediate laminated layers, 6a, has a pattern 9 formed on the surface.

Figure 2E:
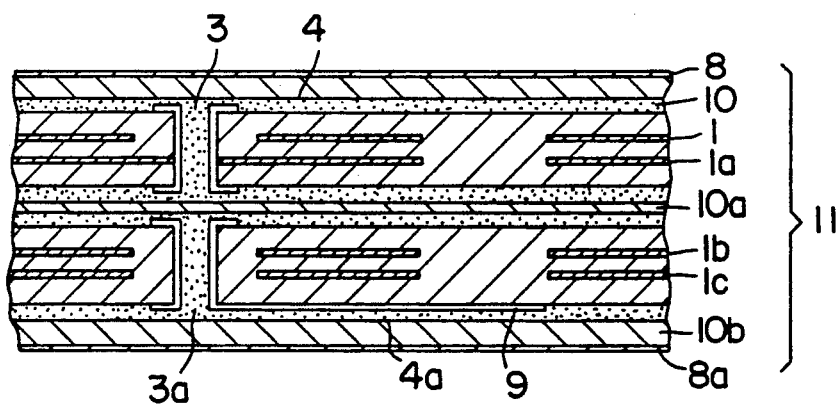

Then, as shown in FIG. 2(E), via the heat and pressure molding step, the intermediate laminated boards 6 and 6a are integrated with the prepreg layers 10, 10a and 10b to obtain a multi-layer molded substrate 11.

Figure 2F:
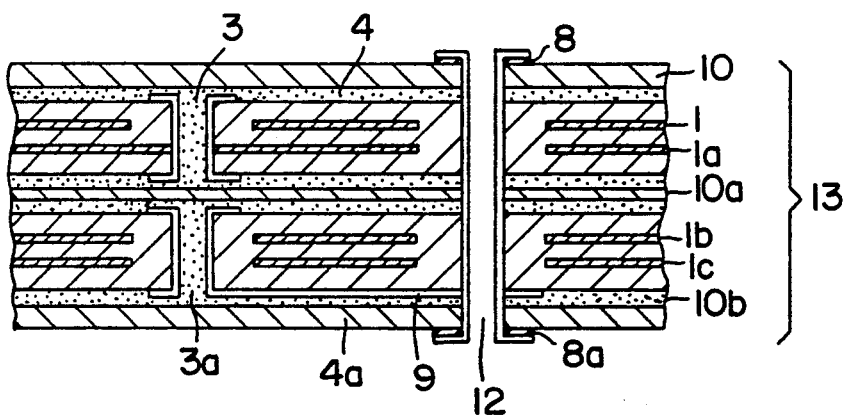

Next as shown in FIG. 2(F), in the multi-layer molded substrate 11, at the predetermined site electrically connectable to the pattern 9, T/H process and photoprinting process according to the prior art methods are applied to form a penetrated via hole 12, whereby a multi-layer printed wiring board 13 according to the first embodiment is obtained.

The second embodiment of the present invention is described.

First, an intermediate laminated board 6 is formed according to the same preparation process as in the first embodiment.

In the next step, the heat-resistant resin 4 on the intermediate laminated board 6 is roughened by applying the $CF_4$—$O_2$ type plasma treatment.

Subsequently, according to the same prepreparation process as in the first embodiment 1, a multi-layer printed wiring board 13 is obtained.

In this embodiment, the surface layer of the heat-resistant resin 4 is roughened, whereby the area adhered with the prepreg layers 10, 10a and 10b is increased to improve the interlayer adhesion strength and facilitate formation of the penetrated through hole 12 with higher aspect ratio. At the same time heat resistance will advantageously be improved.

As described above, the present invention has the effect as mentioned below by dividing the penetrated through hole.

In using the penetrated through hole as the divided via hole, there is no longer restriction of the thickness of the respective divided via holes on the same lattice point, and it has become possible to use the via holes of a high multi-layer board which cannot be formed in the prior art as the divided via holes, whereby wiring capacity can be dramatically improved.

What is claimed is:

1. A process for preparing a multi-layer printed wiring board, comprising the step of forming a through hole and an external layer circuit on a laminated board of double-sided or multi-layer construction, then coating the whole front and back surfaces of said laminated board with a paste-like heat-resistant resin simultaneously with filling of the resin within said through hole, arranging a copper foil on the whole front and back surfaces of said laminated board, heat and pressure-molding the arrangement in vacuo, and then removing said copper foil to form an intermediate laminated board and the step of multilayer-molding at least two sets of said intermediate laminated boards with a prepreg interposed therebetween via the step of heat and pressure molding.

2. A process according to claim 1, further comprising the step of plasma-treating the heat-resistant resin on said intermediate laminated board and roughening the surface of said heat-resistant resin after the step of forming the intermediate laminated board.

3. A process for preparing a multi-layer printed wiring board comprising:

forming a through hole and an external layer circuit on a laminated board of double-sided or multi-layer construction;

coating the whole front and back surfaces of the laminated board with a paste-like heat-resistant resin including simultaneously filling the through hole with the paste-like heat-resistant resin;

disposing a first copper foil layer over an entire first planar surface of the laminated board and disposing a second copper foil layer over an entire second planar surface of the laminated board to form an arrangement;

heating and pressure-molding the arrangement in a partial vacuum;

entirely removing the first copper foil layer from the first planar surface and entirely removing the second copper foil layer from the second planar surface to form an intermediate laminated board; and heating and pressure-molding at least two of the intermediate laminated boards with a prepreg interposed therebetween to form the multi-layer printed wiring board.

4. A process according to claim 3 including the step of roughening the first and second planar surfaces of the intermediate laminated board.

5. A process for preparing a multi-layer printed wiring board comprising:

forming a through hole and an external layer circuit on a laminated board of double-sided or multi-layer construction;

coating the whole front and back surfaces of the laminated board with a paste-like heat-resistant resin including simultaneously filling the through hole with the paste-like heat-resistant resin;

disposing a first copper foil layer over an entire first planar surface of the laminated board and disposing a second copper foil layer over an entire second planar surface of the laminated board to form an arrangement;

heating and pressure-molding the arrangement in a partial vacuum;

entirely removing the first copper foil layer from the first planar surface and entirely removing the second copper foil layer from the second planar surface to form an intermediate laminated board;

plasma-treating the heat-resistant resin on the intermediate laminated board to roughen a first and a second planar surface of the intermediate laminated board; and heating and pressure-molding at least two of the intermediate laminated boards with a prepreg interposed therebetween to form the multi-layer printed wiring board.

* * * * *